United States Patent
Yoneda

(10) Patent No.: US 11,870,019 B2
(45) Date of Patent: Jan. 9, 2024

(54) WAVELENGTH-CONVERTING MEMBER AND LIGHT EMITTING DEVICE

(71) Applicant: NICHIA CORPORATION, Anan (JP)

(72) Inventor: Akinori Yoneda, Anan (JP)

(73) Assignee: NICHIA CORPORATION, Anan (JP)

( * ) Notice: Subject to any disclaimer, the term of this patent is extended or adjusted under 35 U.S.C. 154(b) by 178 days.

(21) Appl. No.: 17/179,313

(22) Filed: Feb. 18, 2021

(65) Prior Publication Data
US 2021/0273143 A1   Sep. 2, 2021

(30) Foreign Application Priority Data
Feb. 28, 2020   (JP) ................. 2020-033053

(51) Int. Cl.
*H01L 33/50*  (2010.01)
*H01L 33/64*  (2010.01)
*H01L 33/60*  (2010.01)

(52) U.S. Cl.
CPC .......... *H01L 33/507* (2013.01); *H01L 33/502* (2013.01); *H01L 33/505* (2013.01); *H01L 33/644* (2013.01); *H01L 33/60* (2013.01)

(58) Field of Classification Search
CPC ... H01L 33/502; H01L 33/505; H01L 33/507; H01L 33/60; H01L 33/644; F21V 17/12; F21V 29/503; F21V 29/70; F21V 9/30; F21Y 2115/10; F21Y 2115/30
See application file for complete search history.

(56) References Cited

U.S. PATENT DOCUMENTS

| | | | | |
|---|---|---|---|---|
| 2012/0126265 A1* | 5/2012 | Hsu | ........................ | H01L 33/504 257/E33.061 |
| 2015/0316233 A1* | 11/2015 | Kawamata | .............. | F21V 13/08 29/428 |
| 2015/0325757 A1* | 11/2015 | Shuhei | .................. | H01L 33/505 257/98 |

(Continued)

FOREIGN PATENT DOCUMENTS

| JP | H10-223701 A | 8/1998 |
|---|---|---|
| JP | 2007234753 A | 9/2007 |

(Continued)

*Primary Examiner* — Matthew C Landau
*Assistant Examiner* — Dmitriy Yemelyanov
(74) *Attorney, Agent, or Firm* — Global IP Counselors, LLP

(57) ABSTRACT

A wavelength-converting member includes a wavelength-converting layer, a heat-dissipating component, and a securing member. The wavelength-converting layer has an upper surface, a lower surface, and one or more lateral surfaces with each of the one or more lateral surfaces of the wavelength-converting layer defining an inclined surface inclined at an acute angle with respect to the lower surface of the wavelength-converting layer. The wavelength-converting layer includes a thermally conductive part, and a fluorescent material containing part in contact with the thermally conductive part. The wavelength-converting layer is mounted on the heat-dissipating component. The securing member is secured to the heat-dissipating component. The securing member presses the inclined surface of each of the one or more lateral surfaces such that the wavelength-converting layer is secured to the heat-dissipating component.

19 Claims, 6 Drawing Sheets

(56) References Cited

U.S. PATENT DOCUMENTS

2018/0216800 A1    8/2018  Yamanaka et al.
2018/0233633 A1*   8/2018  Yamanaka ................ F21V 7/24

FOREIGN PATENT DOCUMENTS

| | | | |
|---|---|---|---|
| JP | 2011028972 A | | 2/2011 |
| JP | 2012169340 A | | 9/2012 |
| JP | 2012226986 A | * | 11/2012 |
| JP | 2012226986 A | | 11/2012 |
| JP | 2013012570 A | | 1/2013 |
| JP | 2013074274 A | | 4/2013 |
| JP | 2016134571 A | | 7/2016 |
| JP | 2017076534 A | | 4/2017 |
| WO | 2017056470 A1 | | 4/2017 |
| WO | 2018073065 A1 | | 4/2018 |

\* cited by examiner

WAVELENGTH-CONVERTING MEMBER AND LIGHT EMITTING DEVICE

CROSS-REFERENCE TO RELATED PATENT APPLICATION

The present application claims priority under 35 U. S. C. § 119 to Japanese Patent Application No. 2020-033053, filed Feb. 28, 2020, the contents of which are hereby incorporated herein by reference in its entirety.

BACKGROUND

Technical Field

The present disclosure relates to a wavelength-converting member and a light emitting device.

Description of Related Art

Light emitting devices using semiconductor light emitting elements have been known. In such light emitting devices, there has been proposed a structure configured to secure a wavelength-converting layer having a fluorescent layer to be irradiated with light to a heat-dissipating member by using a securing member (for example, see WO 2017/056470 A and JP 2012-226986 A).

SUMMARY OF THE INVENTION

However, a separation between the heat-dissipating member and the wavelength-converting layer may occur, depending on the type of securing. The present disclosure is devised in the light of such circumstances, and it is hence an object thereof to provide a highly-reliable wavelength-converting member and a highly-reliable light emitting device in which occurrence of detachment of a wavelength-converting layer from a heat-dissipating member can be reduced.

The embodiments include the aspects described below.
(1) A wavelength-converting member includes a wavelength-converting layer, a heat-dissipating component, and a securing member. The wavelength-converting layer has an upper surface, a lower surface, and one or more lateral surfaces with each of the one or more lateral surfaces of the wavelength-converting layer defining an inclined surface inclined at an acute angle with respect to the lower surface of the wavelength-converting layer. The wavelength-converting layer includes a thermally conductive part, and a fluorescent material containing part in contact with the thermally conductive part. The wavelength-converting layer is mounted on the heat-dissipating component. The securing member is secured to the heat-dissipating component. The securing member presses the inclined surface of each of the one or more lateral surfaces such that the wavelength-converting layer is secured to the heat-dissipating component.
(2) A light emitting device includes the wavelength-converting member described above and a light source configured to irradiate light to the fluorescent material containing part of the wavelength-converting layer of the wavelength-converting member described above.

Using the wavelength-converting member and the light emitting device allows to reduce possibility of detachment of the wavelength-converting member from the heat-dissipating component.

DETAILED DESCRIPTION OF EMBODIMENTS

Figure 1A:
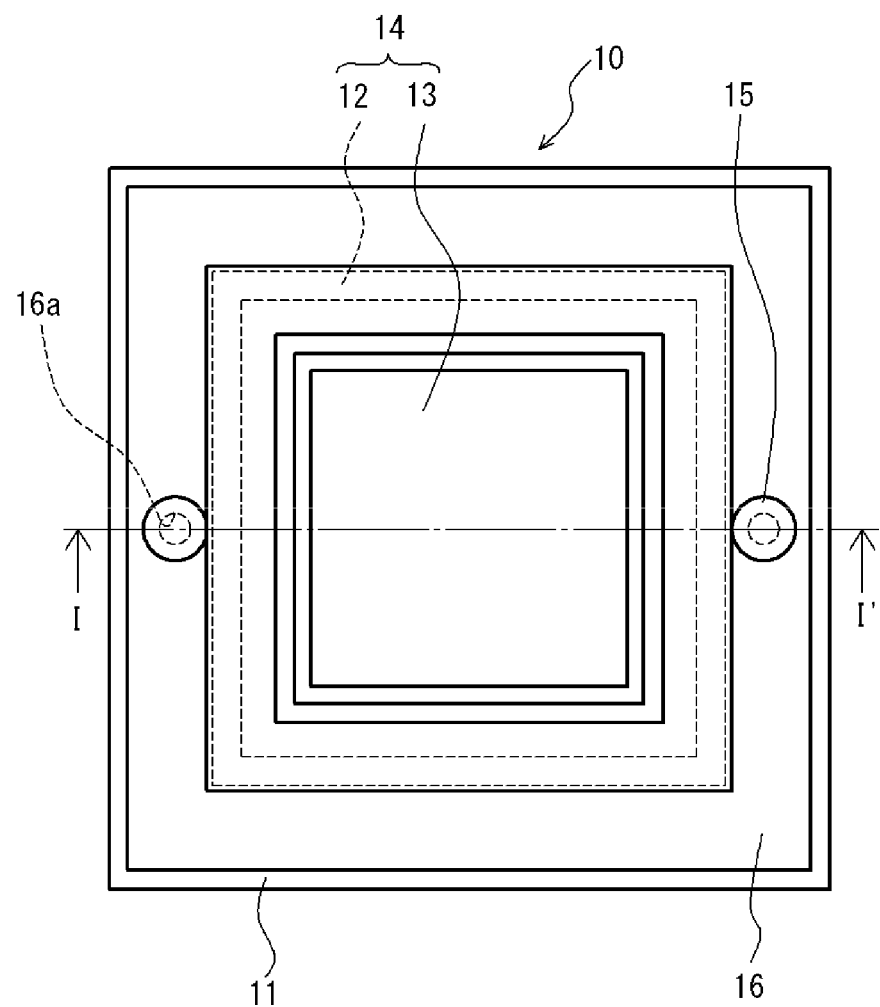
FIG. 1A is a schematic plan view illustrating a structure of a wavelength-converting member according to a first embodiment of the present disclosure.

Certain embodiments according to the present invention will be described below with reference to the accompanying drawings. However, the embodiments illustrated below are intended to embody the technical idea of the present invention, and the present invention is not limited to those described below unless otherwise specified. The size, positional relationship and the like in the drawings may be exaggerated for the sake of clarity. In addition, members with the same name as other forms of implementation represent the same or corresponding members. Such materials may be used in other forms of implementation, such as materials and sizes, unless otherwise stated.

First Embodiment: Wavelength-Converting Member 10

Figure 1B:
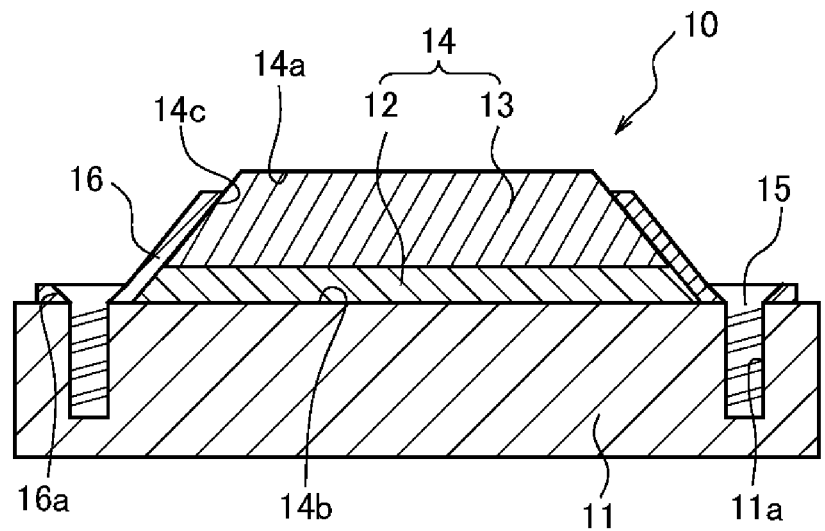
FIG. 1B is a schematic cross-sectional view taken along line I-I' of FIG. 1A.

For example, as shown in FIG. 1A and FIG. 1B, a wavelength-converting member 10 according to a first embodiment includes a wavelength-converting layer 14, a heat-dissipating component 11, and a securing member 16. The wavelength-converting layer 14 includes a thermally conductive part 12 and a fluorescent material containing part 13 that is in contact with the thermally conductive part 12. The wavelength-converting layer 14 includes at least an upper surface 14a, a lower surface 14b, and one or more lateral surfaces. The one or more lateral surfaces of the wavelength-converting layer 14 includes inclined surfaces 14c, which are at an acute angle with respect to the lower surface 14b. The wavelength-converting layer 14 is mounted on the heat-dissipating component 11. A securing member 16 is secured to the heat-dissipating member 11. The securing member 16 is configured to press the inclined surfaces 14c of the wavelength-converting layer 14 to secure the wavelength-converting layer 14 to the heat-dissipating component 11.

With such a configuration, that is, mechanically securing the wavelength-converting layer 14 to the heat-dissipating component 11 with the use of the securing member 16 allows to reduce the possibility of thermal expansion of each of the members affect securing strength of the wavelength-converting layer 14 to the heat-dissipating component 11, even in the presence of difference in the thermal expansion coefficient between the thermally conductive part 12, the fluorescent material containing part 13, and the heat-dissipating component 11. When those components are secured by an adhesive or a bonding layer, etc., and when generation of heat due to light irradiated on the wavelength-converting layer and cooling by stopping the irradiation are repeated, cracks may occur in the adhesive and/or the bonding layer, etc. due to the difference in the thermal expansion coefficient among the components. Because the wavelength-converting layer is secured to the heat-dissipating member 16 by using the securing member 16 and not by using an adhesive, a bonding layer, or the like, a reduction in a securing strength caused by such cracks can be avoided, such that possibility of the fluorescent material containing part 13 detaching from the thermally conductive part 12 can be reduced. Further, due to the absence of a member such as an adhesive or a bonding layer other than and between the fluorescent material containing part 13 and the thermally conductive part 12, the heat from the fluorescent material containing part 13 that is generated due to the irradiation of light on the fluorescent material containing part 13 can be dissipated directly to the thermally conductive part 12. Therefore, efficient heat dissipation can be expected. As a result, it is possible to obtain a reliable wavelength-converting member 10.

In addition, the wavelength-converting layer 14 has one or more inclined surfaces 14c, and the one or more inclined surfaces 14c are pressed by the securing member 16. This can eliminate the need of pressing the upper surface 14a of the wavelength-converting layer 14 by the securing member 16. Accordingly, it is not necessary to dispose the securing member 16 on the upper surface 14a of the wavelength-converting member 14.

When the securing member 16 is disposed on the upper surface 14a, light emitted from the upper surface 14a may be blocked, but the absence of the securing member 16 on the upper surface 14a can improve the light extraction efficiency of the wavelength conversion layer 14.

Wavelength-Converting Layer 14

The wavelength-converting layer 14 includes a thermally conductive part 12 and a fluorescent material containing part 13. The wavelength-converting layer 14 may also include one or more other components. Wavelength-converting, the function of the wavelength-converting layer 14 can be achieved with the presence of the fluorescent material containing part 13, such that the thermally conductive part 12 may be omitted. In view of improving heat dissipation, it is preferable that the wavelength-converting layer 14 includes not only the fluorescent material containing part 13 but also a thermally conductive part 12 that does not contain a fluorescent material. It is preferable that the thermally conductive part 12 and the fluorescent material containing part 13 are disposed in this order and at least partially in contact with each other, on a heat-dissipating component 11. With this configuration, efficient heat dissipation can be expected. For more efficient heat dissipation, it is preferable that the whole lower surface of the fluorescent material containing part 13 is in contact with the thermally conductive part 12.

The one or more lateral surfaces of the wavelength-converting layer 14 includes one or more inclined surfaces 14c, which are at an acute angle with respect to the lower surface 14b of the wavelength-converting layer 14. Each of the one or more inclined surfaces 14c may be a portion of, or the entire portion of a corresponding one of the one or more lateral surfaces. The one or more lateral surfaces of the wavelength-converting member 10 may include a plurality of inclined surfaces that have different angles with respect to the lower surface of the wavelength-converting member 10. The one or more inclined surfaces 14c can be arranged at angles in a range of 45 to 85° with respect to the lower surface 14b. The upper surface 14a and the lower surface 14b of the wavelength-converting layer 14 can be in parallel to each other. In the present embodiment, the term "a lateral surface of the wavelength-converting layer 14" refers to a surface connecting the lower surface 14b and the upper surface 14a of the wavelength-converting layer 14.

The wavelength-converting layer 14 is a direct-bonded layer (the thermally conductive part 12 and the fluorescent material containing part 13 are directly bonded to each other) or an integrally sintered layer (the thermally conductive part 12 and the fluorescent material containing part 13 are integrally sintered together) of the thermally conductive part 12 and the fluorescent material containing part 13. In the present specification, the terms "a direct-bonded layer" and "directly bonded" refer to a layer in which constituent parts are bonded without using an adhesive, and can be formed by using a method appropriately selected from various direct-bonding methods. In the present specification, the terms "integrally sintered layer" and "integrally sintered" refer to a layer in which sintered bodies (namely, ceramics) are integrated without the use of an adhesive, and formed by sintering together.

Thermally Conductive Part 12

The thermally conductive part 12 is a component of the wavelength-converting layer 14 that can hold the fluorescent material containing part 13. In view of generation of heat by the fluorescent material containing part 13, the thermally conductive part 12 is preferably made of a heat-resistant material. It is also preferable that the thermally conductive part 12 is made of a material having a small difference in the thermal expanding coefficient with that of the fluorescent material containing part 13. It is also preferable that the thermally conductive part 12 is a light-reflecting member. Accordingly, light from the fluorescent material containing part 13 can be reflected at the thermally conductive part 12, such that a major part of light from the fluorescent material containing part 13 can be diverted or prevented from reaching the heat-dissipating component 11. As a result, it is possible to reduce or prevent a reduction in luminous efficiency due to absorption of light in heat-dissipating component 11.

Examples of the materials of the thermally conductive part 12 include metals, ceramics, resins, glass or a composite material containing one or more of those. Among those, the thermally conductive part 12 is preferably formed using ceramics such as aluminum oxide, aluminum nitride, silicon nitride, or silicon carbide. Accordingly, the thermally conductive part 12 can be made of a material having a relatively high thermal conductivity and allowing the thermally conductive part 12 to be formed integrally with the fluorescent material containing part 13. The thermally conductive part 12 may be used as a light-reflecting member by forming the thermally conductive part 12 with the use of a material of ceramics and a material that can provide a refractive index higher than a refractive index of ceramics made of the material of ceramics. The material having a high refractive index has a refractive index of, for example, equal to or greater than 1.8 or equal to or greater than 2.0. A difference between a refractive index of the material of ceramics and the material having a refractive index higher than that of the material of the ceramics is, for example, equal to or greater than 0.4 or equal to or greater than 0.7. Examples of the material having a high refractive index include a material containing voids filled with a gas such as air, titanium oxide, aluminum oxide, zirconium oxide, yttrium oxide, zirconium oxide, boron nitride, lutetium oxide, and lanthanum oxide.

With the thermally conductive part 12 is made of ceramics, the light-reflecting property and the thermal conductivity can be controlled by adjusting the density of the internal void of appropriate locations. The density of the voids can be adjusted by changing the degree of pressure of the ceramic material. For example, in order to obtain reliable heat-dissipating performance, a portion of the thermally conductive part 12 located close to the lower surface of the fluorescent material containing part 13 preferably includes the void with a density as smaller as possible. The voids can be visually determined by, for example, observing a cross-section of an object with a Scanning Electron Microscope (SEM).

Figure 1C:
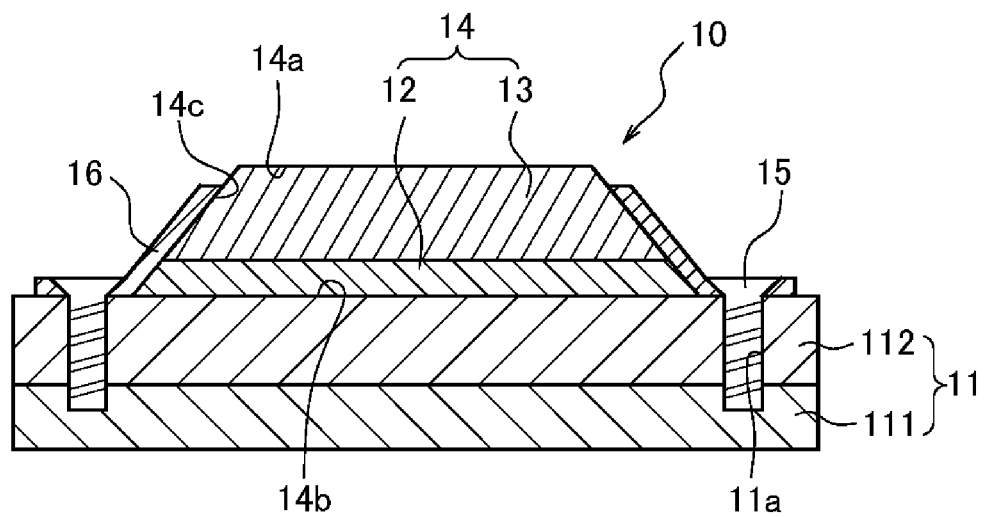
FIG. 1C is a schematic cross-sectional view illustrating a variational example of the wavelength-converting member according to the first embodiment.
Figure 1D:
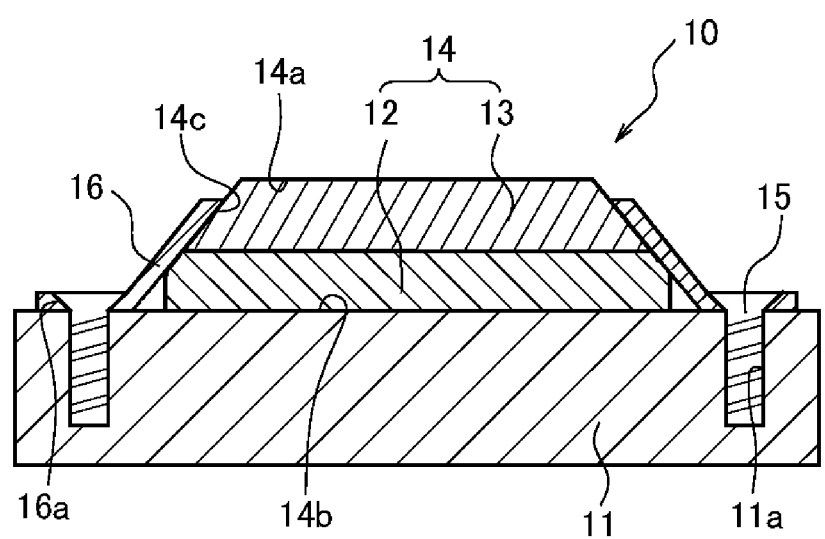
FIG. 1D is a schematic cross-sectional view illustrating another variational example of the wavelength-converting member according to the first embodiment.

The thermally conductive part 12 can have an appropriate shape that allows holding the fluorescent material containing part 13. The thermally conductive part 12 can be a plate-shaped member with one or more flat surfaces. The thermally conductive part 12 can include, for example, an upper surface, a lower surface, and one or more lateral surfaces, with the upper surface and the lower surface being in parallel to each other. The flat and/or parallel upper surface and lower surface of the thermally conductive part 12 can facilitate mounting the thermally conductive part 12 to other components of the wavelength-converting member 10. This in turn can facilitate mounting of the wavelength-converting member 10 to the light emitting device or the like, and can improve the accuracy in extracting light or the like. The one or more lateral surfaces of the thermally conductive part 12 may be perpendicular to the upper surface or lower surface, or it may be curved surfaces. It is preferable that the one or more lateral surfaces of the thermally conductive part 12 are inclined surfaces at an acute angle with respect to the lower surface, as shown in FIG. 1B and FIG. 1C. When the one or more lateral surfaces of the thermally conductive part 12 are set to inclined surfaces, the one or more lateral surfaces of the thermally conductive part 12 can be formed simultaneously when the one or more inclined surfaces are formed in the fluorescent material containing part 13. When the one or more lateral surfaces of the thermally conductive part 12 are inclined surfaces, the angle of the inclined surfaces can be, for example, in a range of 45 to 85° relative to the lower surface. As shown in FIG. 1D, each of the one or more lateral surfaces of the thermally conductive part 12 may include an inclined portion while the rest portion may be approximately perpendicular or substantially perpendicular to the lower surface. Such a shape can be obtained by forming a V-shaped groove of a predetermined depth in a surface of the thermally conductive part 12 by using a blade or the like, and split the thermally conductive part 12 by applying a dicer or the like along the internal apex of the V-shaped groove. This shape allows to increase a thickness of the peripheral portion of the thermally conductive part 12 compared to a shape in which the one or more lateral surfaces are entirely inclined surfaces. Accordingly, the occurrence of breaking of the peripheral portion of the thermally conductive part 12 can be reduced.

The thermally conductive part 12 can be formed in an appropriate shape in a plan view according to a shape or the like of a light emitting device to which the thermally conductive part 12 be applied, and examples of the shape include a circular shape, an oval shape, or a polygonal shape such as a square shape. The thermally conductive part 12 can have a size, for example, having a side or a diameter in a range of 1 to 50 mm in a plan view. The shape in a plan view referred above can be either of the upper surface and/or of the lower surface.

The thermally conductive part 12 can have a thickness, in view of mechanical strength, for example, equal to or greater than 0.2 mm. In order to minimize a rise in cost and a need for increasing the thickness, the thermally conductive part 12 preferably has a thickness of 0.2 mm or less. The upper surface of the thermally conductive part 12 may be flush with the lower surface of the fluorescent material containing part to be described below, as shown in FIG. 1B.

Fluorescent Material Containing Part 13

The fluorescent material containing part 13 contains one or more fluorescent materials. The fluorescent material containing part 13 is preferably made of ceramics containing one or more fluorescent materials or a single crystal of a fluorescent material. Compared to the fluorescent material containing part made of a resin containing a fluorescent material, this arrangement allows for the fluorescent material containing part 13 to have higher heat-resisting property, which allows for the usage in laser light irradiation over a relatively long period of time. Examples of the ceramics used as the fluorescent material containing part 13 include, ceramics formed by sintering a light-transmissive material such as aluminum oxide ($Al_2O_3$, melting point: approximately 1900 to 2100° C.) and one or more fluorescent material. The phosphor content can be in a range of 0.05 to 50 volume percent of the total volume of ceramics. Also, sintered ceramics made substantially sorely of a fluorescent material may be employed.

An appropriate fluorescent material known in the art may be contained in the fluorescent material containing part 13. Examples of the fluorescent materials include yttrium aluminum garnet (YAG) fluorescent materials activated with cerium, lutetium aluminum garnet (LAG) fluorescent materials activated with cerium, silicate fluorescent materials activated with europium, α-sialon-based fluorescent materials, β-sialon-based fluorescent material, and potassium fluosilicate-based (KSF) fluorescent materials. Among those, it is preferable to employ a YAG fluorescent material, because of its good heat resistance.

The fluorescent material containing part 13 has a shape that allows the entire or a portion of the fluorescent material containing part 13 to be mounted on the thermally conductive part 12. The fluorescent material containing part 13 may have a shape with flat surfaces. For example, the fluorescent material containing part 13 can have a polygonal shape in a plan view, an upper surface and a lower surface which are in parallel to each other, and a plurality of lateral surfaces which are in parallel to each other. Having parallel upper and lower surfaces allows the distribution of wavelength converted light in the wavelength-converting member 10 to approach uniformity. As shown in FIG. 1A, the fluorescent material containing part 13 is preferably disposed such that an entire surface of the lower surface of the fluorescent material containing part 13 is on the upper surface of the thermally conductive part 12. With this arrangement, heat from the fluorescent material containing part 13 can be efficiently released to the thermally conductive part 12. As shown in FIG. 1A, each of the one or more lateral surfaces of the fluorescent material containing part 13 may include at least a portion inclined at an acute angle with respect to the lower surface of the fluorescent material containing part 13, or may entirely inclined an acute angle with respect to the lower surface of the fluorescent material containing part 13. The angle of the inclined surface(s) of the fluorescent material containing part 13 can be, for example, in a range of 45 to 85° with respect to the lower surface of the fluorescent material containing part 13. The angle of the inclined surface(s) of the fluorescent material containing part 13 may be different from an angle of the inclined surface(s) of the thermally conductive part 12, but as shown in FIG. 1B and FIG. 1C, it is preferable that the inclined surface(s) of the fluorescent material containing part 13 and the inclined surface(s) of the thermally conductive part 12 are continuous with the same inclination angle. This arrangement makes it easier to form the inclined surface(s) of the fluorescent material containing part 13 and the thermally conductive part 12 in one step. When at least a portion of each of the one or more lateral surfaces of the thermally conductive part 12 is an inclined surface and the inclined surface is secured by pressing down using the securing member 16, a corresponding one or more lateral surface of the fluorescent material containing part 13 may be perpendicular to its upper surface or lower surface. When each of the one or more lateral surfaces of the fluorescent material containing part 13 are perpendicular to its upper surface, the light extraction efficiency from its upper surface can be improved compared to the light extraction efficiency when the one or more lateral surfaces of the fluorescent material containing part 13 are inclined at an obtuse angle with respect to the upper surface.

The fluorescent material containing part 13 can be formed in an appropriate shape in a plan view according to the shape or the like of the light emitting device to which it to be applied, examples of the shape include a circular shape, an elliptic shape, a polygonal shape such as a quadrangular shape. The shape of the fluorescent material containing part 13 in a plan view can be determined either of the upper surface or the lower surface. The shape of the fluorescent material containing part 13 in a plan view can be formed with a same size, or smaller or greater than that of the thermally conductive part 12. For example, a shape in a plan view with a side or a diameter in a range of 0.4 to 55 mm can be employed. Among those, it is preferable that the fluorescent material containing part 13 has a size with which the outer periphery of the fluorescent material containing part 13 in a plan view is aligned with the outer periphery of the thermally conductive part 12, or is located inward of the outer periphery of the thermally conductive part 12. With this arrangement, the entire lower surface of the fluorescent material containing part 13 can be disposed on the upper surface of the thermally conductive part 12.

In view of physical strength, the fluorescent material containing part 13 can have a thickness of, for example, 0.2 mm or greater. In order to minimize a rise in cost and a need for increasing the height of the fluorescent material containing part 13, and to obtain an appropriate degree of wavelength conversion in the fluorescent material containing part 13, the fluorescent material containing part 13 preferably has a thickness of 5.0 mm or less.

Securing Member 16

Figure 1E:
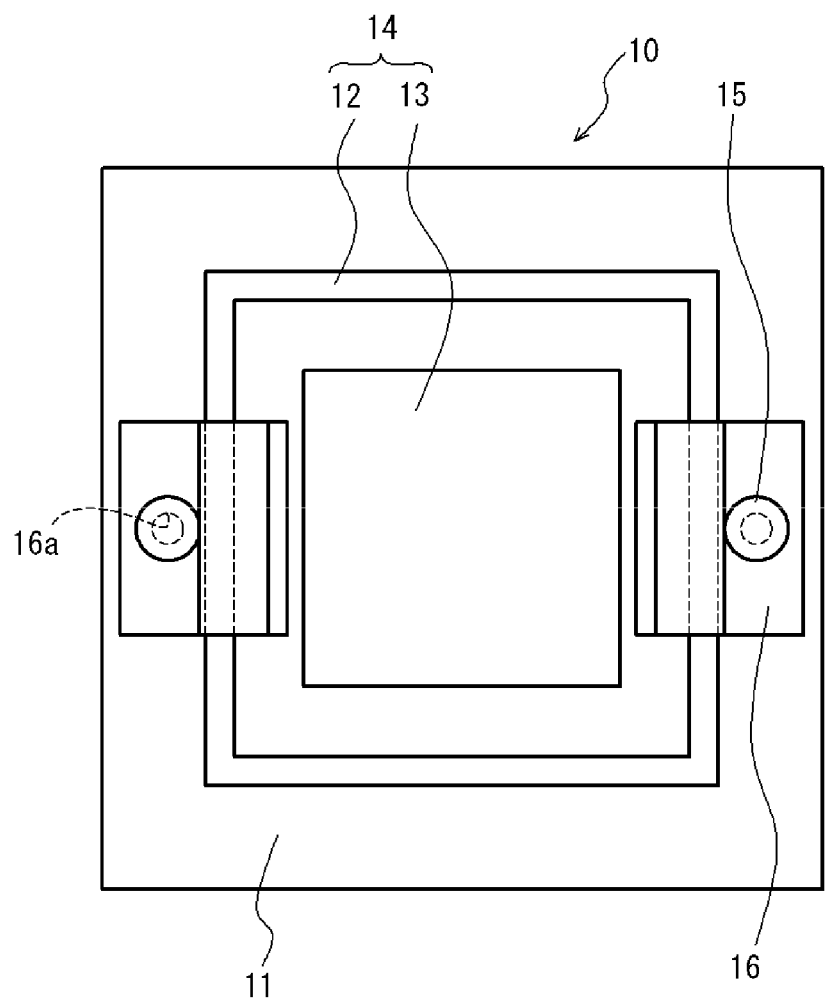
FIG. 1E is a schematic plan view illustrating still another variational example of the wavelength-converting member according to the first embodiment.

The securing member 16 is configured to secure the wavelength-converting layer 14 to the heat-dissipating component 11. Thus, the securing member 16 is disposed pressing the one or more inclined surfaces 14c of the wavelength-converting layer 14 and is secured to the heat-dissipating component 11. The securing member 16 does not have to have an inclined surface as long as it can press down a portion of each of the one or more lateral surfaces of the wavelength-converting layer 14. The securing member 16 preferably has one or more inclined surfaces corresponding to the one or more lateral surfaces of the wavelength-converting layer 14. With this arrangement, the securing member 16 can efficiently press the one or more lateral surfaces 14c of the wavelength-converting layer 14. When the securing member 16 has an inclined surface on the side where it is in contact with the wavelength-converting layer 14, the angle of each of the one or more inclined surfaces of the securing member 16 with respect to the upper surface of the heat-dissipating component 11 can be smaller than the angle between the lower face of the wavelength-converting layer 14 and the each of the inclined surfaces 14c. With this arrangement, the one or more inclined surfaces 14c of the wavelength-converting layer 14 can be more reliably pressed by the securing member 16. The securing member 16 may be configured to press only the thermally conductive part 12, to press only the fluorescent material containing part 13, or to press both the thermally conductive part 12 and the fluorescent material containing part 13. As shown in FIG. 1A, a single securing member 16 may be provided to a single wavelength-converting member 10 or as shown in FIG. 1E, a plurality of securing members 16 may be provided to a single wavelength-converting member 10.

The securing member 16 can have a shape in a plan view that corresponds to at least a portion of the shape of the wavelength-converting layer 14 in a plan view. The securing member 16 can have a shape in a plan view that allows pressing at least a portion of the one or more inclined surfaces 14c of the wavelength-converting layer 14 and also allows the securing member 16 to be secured to the heat-dissipating component 11. For example, in the case that a single securing member 16 is used to press the wavelength-converting layer 14, the securing member 16 can have an outer shape in a plan view that can be appropriately selected from various shapes including a circular shape, an elliptic shape, and a polygonal shape such as a quadrangular shape. In that case, as shown in FIG. 1A, a shape formed with a through-opening to expose the wavelength-converting layer 14 can be employed. The through-opening configured to expose the wavelength-converting layer 14 can be defined in a shape in a plan view such as a circular shape, an elliptic shape, or a polygonal shape such as a quadrangular shape. The opening of the through-opening may be sufficient to expose only a portion of the upper surface 14a of the wavelength-converting layer 14, but it is preferable to be made sufficient to expose the entire upper surface 14a of the wavelength-converting layer 14. When only a portion of the upper surface 14a of the wavelength-converting layer 14 is exposed, for example, the opening of the through-hole is, for example, of a size that is sufficient to secure a region to be irradiated with an excitation light such that a fluorescent material in the fluorescent material containing part 13 can be excited. The region to be irradiated can be of a size slightly larger than the actual size of the excitation light irradiated thereon, as described below. The region to be irradiated can be set according to the type of light source etc., and a shape of the region in a plan view can be selected from various shapes such as a circular shape, an elliptical shape, or a polygonal shape such as a quadrangular shape. The region of the wavelength-converting layer 14 to be irradiated can be, for example, in a range of 0.4 mm×0.4 mm to 2 mm×2 mm, i.e., 0.16 mm² to 4 mm². More specifically, when the light whose wavelength to be converted is a laser light, a side or diameter of the wavelength-converting layer 14 can be in a range of 100 to 3,000 μm.

When a plurality of securing members 16 are used to press the wavelength-converting layer 14, the plurality of securing members 16 may collectively have a shape as described above. Further as shown in FIG. 1E, the plurality of the securing member 16 may also have a shape configured to press at least two locations, which are separated from each other, of the one or more inclined surfaces 14c of the wavelength-converting layer 14. More specific examples of such shapes include a strip shape and a pad shape, which can be disposed in contact with the wavelength-converting layer 14 and the heat-dissipating component 11.

For example, as shown in FIG. 1B, the securing member 16 can have a cross-sectional shape of an L-shape, that includes a securing portion located along the upper surface of the heat-dissipating component 11 and a pressing portion extending upward along the one or more inclined surfaces of the wavelength-converting layer 14.

The securing member 16 can be formed, for example, by a metal, ceramics or a single crystal. Examples of such a metal include copper, aluminum, copper alloy and aluminum alloy. Examples of such ceramics include aluminum nitride, which has a small coefficient of thermal expansion and a high thermal conductivity. Examples of such a single crystal include sapphire. The securing member 16 preferably has a high thermal conductivity, and made of a material suitable for applying pressure, such that a metal is preferably employed.

Examples of methods of securing the securing member 16 to the heat-dissipating component include forming a through-hole 16a in the securing member 16 and screw it into place, welding the securing member 16 to the heat-dissipating component 11, and disposing a bonding member between the securing member 16 and the heat-dissipating component 11.

Through-Hole 16a

The securing member 16 can be formed with one or more through holes 16a. The one or more through-holes 16a can be formed in appropriate locations. In the example shown in FIG. 1A and FIG. 1B, the through-holes 16a are formed at outside the outer edges of both the thermally conductive part 12 and the fluorescent material containing part 13 in a plan view. With this arrangement, the securing member 16 and the heat-dissipating component 11 can be secured more reliably.

Each of the one or more through-holes 16a may be formed with the same cross-sectional shape from its upper end to lower end. Each of the one or more through-holes 16a may also have a cross-sectional shape with upwardly widening opening, downwardly widening, upwardly and downwardly widening, or widening toward a center portion, through entire or a portion in a depth direction. For example, each of the one or more through-holes 16a can be formed in a shape widening upward to accommodate the screw head of the screw 15 described below, such that an upper surface of the screw head and an upper surface of the securing member 16, which is at an opposite side from the heat-dissipating component 11, are flush with each other.

The number of the through holes 16a can be determined as appropriate. For example, when a single securing member 16 is used to press the wavelength-converting layer 14, two or more through-holes 16a are preferably formed to insert the screws 15. With this arrangement, the wavelength-converting layer 14 can be more reliably secured by the securing member 16. Alternatively, when a plurality of securing members 16 are employed to press the wavelength-converting layer 14, two or more through-holes 16a may be formed in each of the securing members 16, or a single through-hole 16a may be formed in each of the securing members 16, allowing the screws 15 inserted through a respective one of the through-holes 16a.

Each of the through-holes 16a can be formed in a shape in conformity to the shape of the screw 15 to be used. Examples of the shape of each of the through holes 16a include a circular shape, an elliptic shape, a polygonal shape such as a quadrilateral shape, or a shape which is a combination of those, in a plan view.

The size of each of the through-holes 16a can be determined appropriately according to the size of the screw 15 to be used, the size and thickness of the wavelength-converting layer 14, etc. Each of the through-holes 16a can be formed with a side or diameter of, for example, in a range of 0.1 to 16 mm, which may be 12 mm or less.

The through-holes 16a can be formed by using a method known in the art. Examples of such methods include sandblasting, etching, cutting and laser processing.

Heat-Dissipating Component 11

The heat-dissipating component 11 can be located below the wavelength-converting layer 14, that is, at the lower surface side of the thermally conductive part 12. It is also preferable that the heat-dissipating component 11 is disposed in contact with the lower surface of the thermally conductive part 12. Such contact allows heat from the fluorescent material containing part 13 and the thermally conductive part 12 to heat-dissipating component 11 directly and efficiently.

The heat-dissipating component 11 can be made of a material that has a thermal conductivity higher than the material of the thermally conductive part 12. The heat-dissipating component 11 can be made of a material such as a light-transmissive material or a light-reflecting material. In the present specification, the term "light-transmissive material" refers to a material having an optical transmittance to light irradiated on the wavelength-converting member 10, for example, a transmittance of 70% or greater, 80% or greater, or 90% or greater. When the thermally conductive part 12 and the heat-dissipating component 11 are made of light-transmissive materials, the excitation light can be extracted from the side. The heat-dissipating component 11 can be made of, for example, a metal, ceramics, or a single crystal. Examples of such metal include, in view of high thermal conductivity, copper, aluminum, copper alloy or aluminum alloy. When the heat-dissipating component 11 is used as a light-reflecting member, a material containing silver may be used to increase the reflectance. For the heat-dissipating component 11, ceramics insulating material such as aluminum nitride that has a small thermal expanding coefficient and a high thermal conductivity may be used. In this case, a metal film may be applied on the surfaces of the heat-dissipating component 11 to increase the reflectance. Such a metal film may contain silver, for example. Examples of such a single crystal include sapphire. For example, as shown in FIG. 1C, the heat-dissipating component 11 may have a multi-layer structure of two or more layers. This allows combinations of various materials to ensure light reflectivity, heat dissipation, etc. In the example shown in FIG. 1C, a metal substrate 112 mainly made of a metal such as copper is arranged at a side to be in contact with the lower surface of the thermally conductive part 12, and a heat sink 111 is arranged as a lower surface. The heat sinks may be mainly made of for example, copper, aluminum, copper alloy or aluminum alloy. The heat sink alone may be used as the heat-dissipating component 11.

The heat-dissipating component 11 may have a shape in a plan view align the outer periphery of the wavelength-converting layer 14, in particular the outer periphery of the lower surface of the thermally conductive part 12, which may be slightly larger or slightly smaller. In particular, in a plan view, the heat-dissipating component 11 is preferably disposed such that the entire outer periphery of the heat-dissipating component 11 is located outer side with respect to the outer periphery of the lower surface of the thermally conductive part 12.

The heat-dissipating component 11 can have a thickness of, for example, in a range of 0.1 to 5 mm, preferably in a range of 0.3 to 3 mm. With this arrangement, reliable mechanical strength of the heat-dissipating component 11 can be obtained and an improvement in heat dissipation can be obtained. Further, the heat-dissipating component 11 has a volume greater than that of the wavelength-converting layer 14. This allows the heat of the wavelength-converting layer 14 to be efficiently dissipated to the heat-dissipating component 11.

The heat-dissipating component 11 is formed with one or more threaded holes 11a. The threaded hole 11a is used to secure the securing member 16 by the one or more screws 15. The number, size, and location(s) of the one or more through-holes 16a of the securing member 16 can be determined corresponding to the number, size, and location(s) of the one or more through-holes formed in the securing 16. In other words, when the wavelength-converting layer 14 is disposed on an appropriate location of the heat-dissipating component 11 and the one or more inclined surfaces of the wavelength-converting layer 14 are pressed by the securing member 16, the one or more threaded holes 11a can be aligned with the one or more through-holes 16a of the securing member 16, with the same size and the same number. The one or more threaded holes 11a are formed with a depth that allows each of the one or more screws 15 inserted in a corresponding one of the one or more through-holes 16a and threaded holes 11a to be secured, which is determined according to the length etc., of the one or more screws 15.

When the wavelength-converting layer 14 is screwed to the heat-dissipating component 11 through the securing member 16, a soft material such as heat-dissipating grease may be disposed between the wavelength-converting layer 14 and the heat-dissipating component 11. By filling the gaps between the wavelength-converting layer 14 and the heat-dissipating component 11 with such a soft member, heat dissipation can be further improved. Also, applying such a soft member can reduce the occurrence of breaking of the wavelength-converting layer 14 etc., in the event of thermal shock.

Screw 15

The wavelength-converting member 10 may also be provided with one or more screws 15. Each screw 15 may have a screw head.

The one or more screws 15 are configured to secure the securing member 16 to the heat-dissipating component 11. Each screw 15 is engaged through a corresponding one of the through-holes 16a of the securing member 16 into a corresponding one of the thread holes 11a of the heat sink component 11.

The length of the one or more screws 15 can be greater than a total length of the one or more through-holes 16a in the securing member 16 and less than a sum of the total length and a depth of the one or more threaded holes 11a in the heat-dissipating component 11.

The thickness of the one or more screws 15 can be set according to the size of the one or more through-holes 16a in the securing member 16 in a plan view and the size of the one or more threaded holes 11a in a plan view.

With engaging each of such one or more screws 15 into a corresponding one of the one or more through-holes 16a and its corresponding threaded hole 11a, the wavelength-converting layer 14 can be secured to the heat-dissipating component 11 using the securing member 16.

The one or more screws 15 can be made of a metal such as SUS or ceramics such as aluminum nitride. When there is a possibility of the one or more screws 15 exposed to light, for example, the one or more screws 15 may be made of a material that hardly absorbs light irradiated on the wavelength-converting layer 14.

Welding Member/Bonding Member

When welding is used as a method of securing the securing member 16 to the heat-dissipating component 11, the heat-dissipating component 11 and/or the securing member 16 may be melt and welded, or a welding member is disposed between the heat-dissipating component 11 and the securing member 16 and melting the welding member to bond the heat-dissipating component 11 and the securing member 16. Alternatively, a bonding member may be disposed between the heat-dissipating component 11 and the securing member 16 to adhere the heat-dissipating component 11 and the securing member 16 or melting the bonding member to secure the heat-dissipating component 11 and the securing member 16. Examples of such a bonding member include a solder material such as tin-bismuth-based, tin-copper-based, tin-silver-based, and gold-tin-based solder materials; a eutectic alloy such as an alloy having Au and Sn as its main components, an alloy having Au and Si as its main component, and an alloy having Au and Ge as its main component, an electrically conductive paste of silver, gold, or palladium, a brazing material of a low-melting-point metal, resin, an adhesive made of a combination of those.

Second Embodiment: Wavelength-Converting Member 20

Figure 2A:
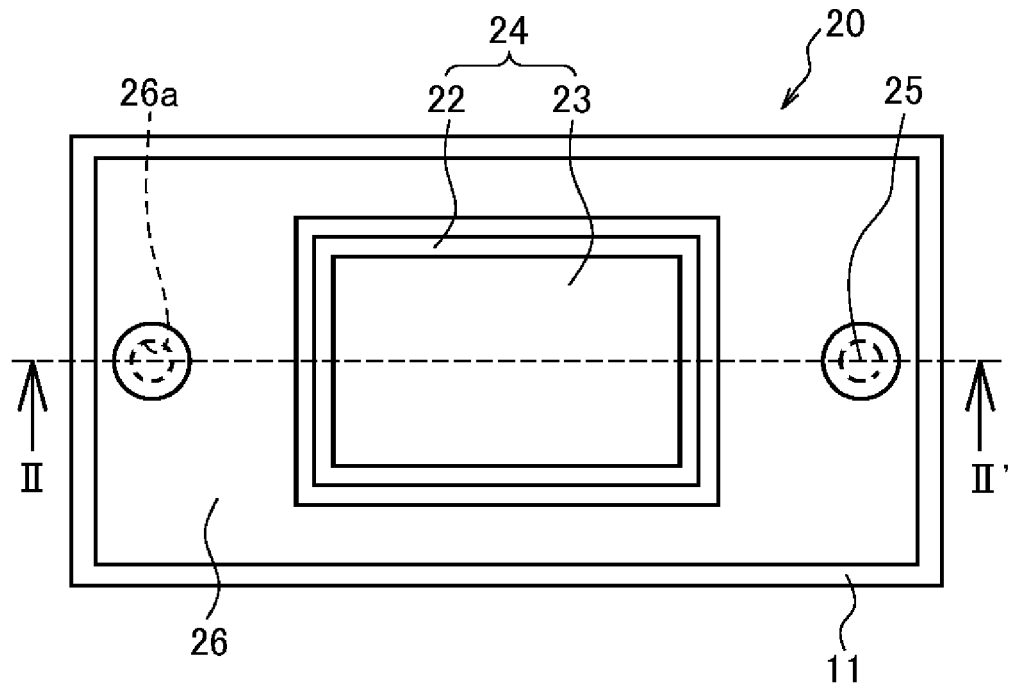
FIG. 2A is a schematic plan view illustrating a structure of the wavelength-converting member according to a second embodiment of the present disclosure.
Figure 2B:
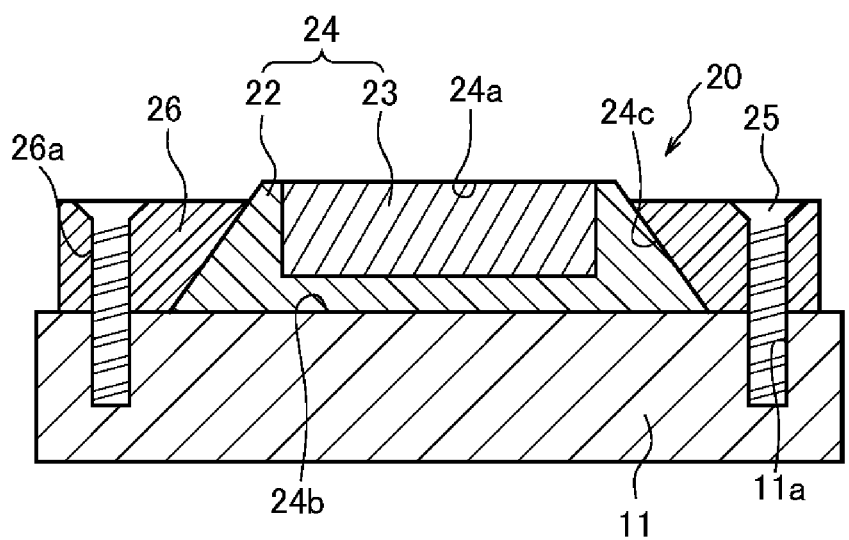
FIG. 2B is a schematic cross-sectional view taken along line II-IF of FIG. 2A.
Figure 3:
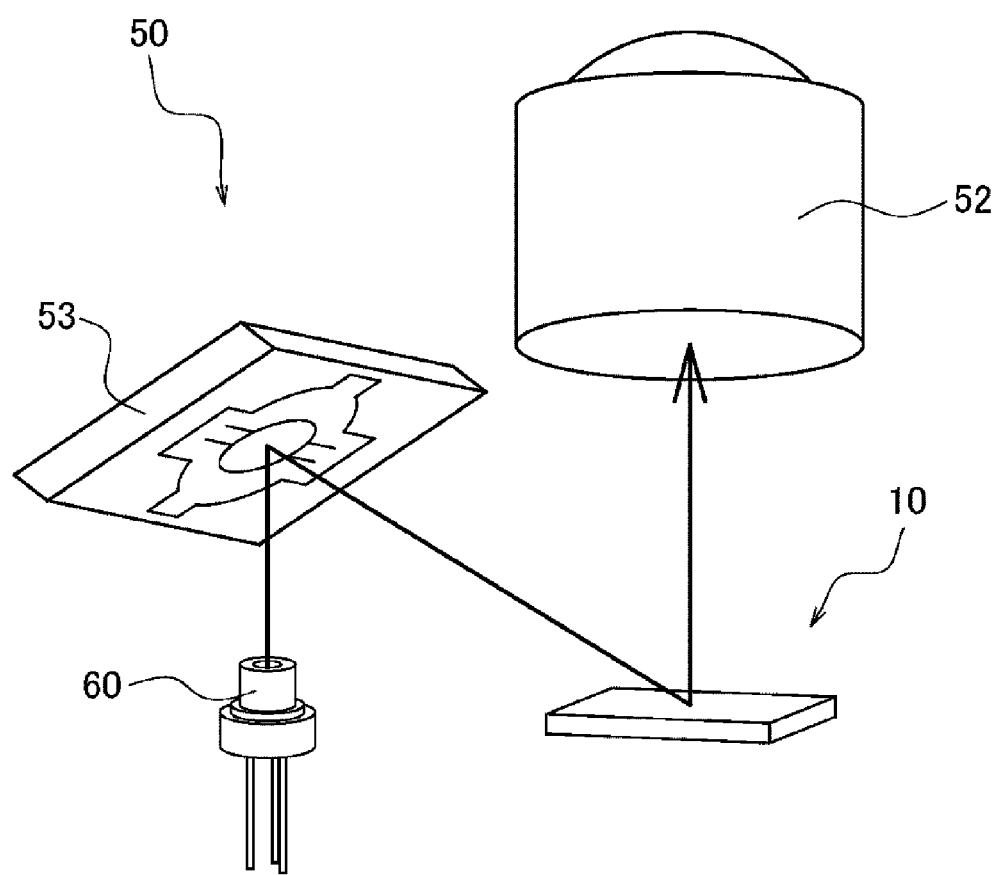
FIG. 3 is a schematic perspective view illustrating a structure of a light emitting device according to a third embodiment of the present disclosure.

As shown in FIG. 2A and FIG. 2B, the wavelength-converting member 20 according to a second embodiment includes a wavelength-converting layer 24, a heat-dissipating component 11, and a securing member 26.

The wavelength-converting layer 24 includes a thermally conductive part 22 and a fluorescent material containing part 23. The wavelength-converting layer 24 includes an upper surface 24a, a lower surface 24b, and one or more inclined surfaces 24c. The lateral surfaces of the fluorescent material containing part 23 includes one or more lateral surfaces which are surrounded by the thermally conductive part 22. In other words, the fluorescent material containing part 23 is surrounded by the thermally conductive part 22 such that an entire lower surface of the fluorescent material containing part 23 is in contact with the thermally conductive part 22, and an entire of the one or more lateral surfaces of the fluorescent material containing part 23 are in contact with the thermally conductive part 22. The fluorescent material containing part 23 can be disposed in a plan view with an area dimension in a range of 50 to 90% with respect to an area dimension of the thermally conductive part 22 (i.e., an area dimension of a shape defined by the outer edge of the lower surface of the thermally conductive part 22). The one or more lateral surfaces of the fluorescent material containing part 23 may be inclined with respect to the lower surface 24b of the wavelength-converting layer 24, or the one or more lateral surfaces of the fluorescent material containing part 23 may be perpendicular to the lower surface 24b of the wavelength-converting layer 24. The upper surface of the fluorescent material containing part 23 may be located below or above the upper surface of the thermally conductive part 22. In the example shown in FIG. 2A and FIG. 2B, the upper surface of the fluorescent material containing part 23 and the upper surface of the thermally conductive part 22 are aligned. In other words, the upper surface of the fluorescent material containing part 23 and the upper surface of the thermally conductive part 22 are flush with each other. The wavelength-converting layer 24 having a shape described above can be obtained by forming the fluorescent material containing part 23 and the thermally conductive part 22 together. In this case, the maximum thickness of the thermally conductive part 22 can be 10 mm or less, and the minimum thickness can be 0.1 mm or greater. The expression "upper surfaces are flush with each other", or "upper surfaces are aligned" refers, in addition to the upper surfaces being located precisely on the same plane, the upper surfaces are offset within 10% of the thickness of the fluorescent material containing part 23.

As shown in FIG. 2B, all the lateral surfaces of the thermally conductive part 22 are inclined surfaces 24c at an angle in a range of 45 to 85° with respect to the lower surface 24b of the thermally conductive part 22.

It is preferable that thermally conductive part 22 is light reflective. This allows the light from the fluorescent material containing part 23 propagating in a lateral direction to be reflected by the thermally conductive part 22 and extracted from the upper surface of the fluorescent material containing part 23. When the thermally conductive part 22 is made of ceramics, adjusting the degree of density of the internal voids allows for adjusting the light reflectivity and thermal conductivity of the thermally conductive part 22. The density of the internal voids in the thermally conductive part 22 may be made different in portions. For example, the porosity (a fraction of the volume of voids with respect to the total volume) of a portion of the thermally conductive part 22 located below the fluorescent material containing part 23 can be set smaller than the porosity of a portion located at lateral side of the fluorescent material containing part 23. With this arrangement, heat dissipation performance can be improved at portions below the fluorescent material containing part 23, and the light-reflecting performance can be improved at portions located lateral side of the fluorescent material containing part 23.

The securing member 26 has a shape in a plan view that corresponds to the shape of the wavelength-converting layer 24, that is, the shape of the thermally conductive part 22 in a plan view. In other words, the securing member 26 has a shape configured to press down on all the inclined surfaces of the wavelength-converting layer 24, and also to secure the wavelength-converting layer 24 to the heat-dissipating component 11. For example, the securing member 26 has an outer shape appropriately selected from various shapes such as a circular shape, an elliptic shape, or a polygonal shape such as a quadrangular shape in a plan view, and is formed with a through-opening defined in a shape such as a circular shape, an elliptic shape, a polygonal shape such as a quadrangular shape in a plan view.

The securing member 26 can have a cross-sectional shape, for example, as shown in FIG. 2B, with a thickness slightly less than a thickness of the wavelength-converting layer 24. The securing member 26 shown in FIG. 2B has a block-shape that includes a surface along the upper surface of the heat-dissipating component 11 and surfaces extending upward from the securing portion, along the inclined lateral surfaces of the wavelength-converting layer 24. The securing member 26 can have a thickness in a range of 50 to 120% with respect to a thickness of the wavelength-converting layer 24. It is preferable that the upper surface of the securing member 26 is located lower than the upper surface of the wavelength-converting layer 24. With this arrangement, blocking or disturbing of light extracted from the upper surface of the wavelength-converting layer 24 by the securing member 26 can be reduced or prevented.

The securing member 26 is formed with one or more through-holes 26a which penetrates through the thickness direction of the securing member 26 at one or more locations outward of the through opening in a plan view. Each of the one or more through-holes 26a is defined with an upwardly widening opening that opens in the upper surface of the securing member 26 to accommodate the screw head of the screw 25, and an opening edge of the through-hole 26a is located near a plane that includes the upper surface of the fluorescent material containing part. With this arrangement, blocking or disturbing of light extracted from the upper surface of the wavelength-converting layer 24 by the one or more screws 25 can be reduced or prevented.

The wavelength-converting member 20 according to the second embodiment can have a structure similar to that of the wavelength-converting member 10 according to the first embodiment, except for the configuration described above. The effects that can be obtained by the configuration similar to that of the wavelength-converting member 10 according to the first embodiment have been similar to those described in the first embodiment.

When the thermally conductive part 22 of the wavelength-converting member 20 according to the second embodiment has light-reflecting properties, light emitted in a lateral direction from the fluorescent material containing part 23 can be reduced or prevented and the light extraction efficiency from the upper surface of the fluorescent material containing part 23 can be improved.

Third Embodiment: Light Emitting Device 50

The light emitting device 50 according to a third embodiment includes the wavelength-converting member 10 and a light source 60 configured to irradiate light to the fluorescent material containing part of the wavelength-converting member 10.

With such a light emitting device 50, light emitted from the light source 60 and transmitted through the wavelength-converting member 10 can be emitted to the outside through an optical member 52 that can change the light into light having a desired light distribution. Further, a spatial light modulator 53 may be placed between the light source 60 and the wavelength-converting member 10 in order to direct light emitted from the light source 60, for example, a laser light, to enter the wavelength-converting member 10 at a specific angle. Details of the wavelength-converting member 10 have been described in the first embodiment. In place of the wavelength-converting member 10, the wavelength-converting member 20 according to the second embodiment may be employed.

With the configuration as described above, light from the light source 60 can be guided to enter the wavelength-converting member 10, as designed, with substantially all the main portions of the light enter the wavelength-converting member 10. A portion of the light is then wavelength-converted by the fluorescent material contained in the fluorescent material containing part, or a different portion of light is reflected and is directed to the outside world. These wavelength-converted light can be mixed with light whose wavelength has not been converted, and can be emitted to the outside, for example, as a white light. Further, the heat-dissipating component located below the wavelength-converting layer can effectively dissipate the heat generated by the irradiation of light, thus maintaining the operation of the light emitting device for a long period of time.

The light source 60 is configured to emit an excitation light. Examples thereof include a light emitting diode (LED), a semiconductor laser element, or one in which a light emitting diode (LED) or a semiconductor laser element is encapsulated in a package. By using a semiconductor laser device, the area of the light incidence surface of the fluorescent material containing part tent can be reduced compared to that using an LED. As a result, the size of the light emitting device 50 can be reduced to a smaller size. Further, a reliable heat-dissipating effect can be maintained by the thermally conductive part and the heat-dissipating member.

For the spatial optical modulator 53, a micro electromechanical system (MEMS) etc., known in the art can be employed.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A wavelength-converting member comprising:
   a wavelength-converting layer having an upper surface, a lower surface, and one or more lateral surfaces with the upper surface having a surface area smaller than a surface area of the lower surface, and each of the one or more lateral surfaces of the wavelength-converting layer defining a first inclined surface inclined at an acute angle with respect to the lower surface of the wavelength-converting layer, the wavelength-converting layer including
      a thermally conductive part, and
      a fluorescent material containing part in contact with the thermally conductive part;
   a heat-dissipating component on which the wavelength-converting layer is mounted, the heat-dissipating component defining at least one threaded hole;
   a securing member having a second inclined surface in contact with and pressing the first inclined surface such that the wavelength-converting layer is secured to the heat-dissipating component, the securing member defining at least one through hole; and
   at least one screw inserted through the at least one through hole and fitted in the at least one threaded hole so that the securing member is secured to the heat-dissipating component by the at least one screw.

2. The wavelength-converting member according to claim 1, wherein the at least one screw has a screw head located flush with or projecting above an upper surface of the securing member.

3. The wavelength-converting member according to claim 1, wherein
   the thermally conductive part and the fluorescent material containing part of the wavelength-converting layer are directly-bonded to each other or integrally sintered together.

4. The wavelength-converting member according to claim 1, wherein
   the thermally conductive part of the wavelength-converting layer is made of ceramics.

5. The wavelength-converting member according to claim 1, wherein
   the thermally conductive part of the wavelength-converting layer is a light-reflecting member.

6. The wavelength-converting member according to claim 1, wherein
   each of the fluorescent material containing part and the thermally conductive part of the wavelength-converting layer has an upper surface, a lower surface, and one or more lateral surfaces, and
   an outer periphery of the fluorescent material containing part is located inward of an outer periphery of the thermally conductive part when seen from above.

7. The wavelength-converting member according to claim 6, wherein
   the upper surface of the fluorescent material containing part is flush with the upper surface of the thermally conductive part.

8. The wavelength-converting member according to claim 1, wherein
   each of the fluorescent material containing part and the thermally conductive part of the wavelength-converting layer partially defines the first inclined surface of the wavelength-converting layer.

9. The wavelength-converting member according to claim 1, wherein
   the thermally conductive part of the wavelength-converting layer defines the inclined surface of the wavelength-converting layer.

10. A light emitting device comprising:
    the wavelength-converting member according to claim 1; and
    at least one light source configured to irradiate light on the fluorescent material containing part of the wavelength-converting layer of the wavelength-converting member.

11. A light emitting device comprising:
    a wavelength-converting layer having an upper surface, a lower surface, and one or more lateral surfaces with each of the one or more lateral surfaces of the wavelength-converting layer defining a first inclined surface inclined at an acute angle with respect to the lower surface, the wavelength-converting layer including
       a first part made of sintered ceramics, and
       a second part in contact with the first part and containing fluorescent material;
    a heat-dissipating component on which the wavelength-converting layer is mounted;
    a securing member secured to the heat-dissipating component, the securing member having a second inclined surface pressing the first inclined surface such that the wavelength-converting layer is secured to the heat-dissipating component; and
    at least one light source configured to irradiate light on the second part.

12. The light emitting device according to claim 11, further comprising
    at least one screw, wherein
    the securing member defines at least through hole,
    the heat-dissipating component defines at least one threaded hole, and
    the at least one screw is inserted through the at least one through hole and fitted in the at least one threaded hole so that the securing member is secured to the heat-dissipating component by the at least one screw.

13. The light emitting device according to claim 12, wherein
    the at least one screw has a screw head located flush with or projecting above an upper surface of the securing member.

14. The light emitting device according to claim 11, wherein
the first part and the second part of the wavelength-converting layer are directly bonded to each other or integrally sintered together.

15. The light emitting device according to claim 11, wherein
the first part is a light-reflecting member.

16. The light emitting device according to claim 11, wherein
each of the second part and the first part has an upper surface, a lower surface, and one or more lateral surfaces, and
an outer periphery of the second part is located inward of an outer periphery of the first part when seen from above.

17. The light emitting device according to claim 16, wherein
the upper surface of the second part is flush with the upper surface of the first part.

18. The light emitting device according to claim 11, wherein
each of the first part and the second part of the wavelength-converting layer partially defines the first inclined surface of the wavelength-converting layer.

19. The light emitting device according to claim 11, wherein
the first part of the wavelength-converting layer defines the inclined surface of the wavelength-converting layer.

* * * * *